United States Patent [19]

Mizuno

[11] Patent Number: 5,698,883

[45] Date of Patent: Dec. 16, 1997

[54] MOS FIELD EFFECT TRANSISTOR AND METHOD FOR MANUFACTURING THE SAME

[75] Inventor: Tomohisa Mizuno, Kanagawa-ken, Japan

[73] Assignee: Kabushiki Kaisha Toshiba, Kawasaki, Japan

[21] Appl. No.: 654,754

[22] Filed: May 28, 1996

Related U.S. Application Data

[63] Continuation of Ser. No. 590,810, Oct. 1, 1990, abandoned.

[30] Foreign Application Priority Data

Oct. 9, 1989 [JP] Japan .................. P01-262059

[51] Int. Cl.$^6$ .................. H01L 29/76; H01L 29/94; H01L 31/062; H01L 27/088

[52] U.S. Cl. .................. 257/344; 257/408; 257/410; 257/900

[58] Field of Search .................. 357/23.3, 23.11, 357/2; 257/336, 344, 408, 410, 411, 900

[56] References Cited

U.S. PATENT DOCUMENTS

| | | | |
|---|---|---|---|
| 4,638,347 | 1/1987 | Iyer | 357/23.3 |
| 4,894,694 | 1/1990 | Cham et al. | 357/23.3 |
| 4,935,379 | 6/1990 | Toyoshima | 357/23.3 |
| 4,954,867 | 9/1990 | Hosaka | 357/23.3 |

FOREIGN PATENT DOCUMENTS

| | | | |
|---|---|---|---|
| A0329047 | 8/1989 | European Pat. Off. | 357/23.3 |
| 59-124768 | 7/1984 | Japan | 352/23.5 |
| 59-231864 | 12/1984 | Japan | 357/23.3 |
| 60-158669 | 8/1985 | Japan | 357/23.3 |
| 62-42564 | 2/1987 | Japan | 357/2 |
| 62-156873 | 7/1987 | Japan | 357/23.3 |
| 62-160770 | 7/1987 | Japan | 357/23.3 |
| 63-140580 | 6/1988 | Japan | 357/2 |
| 63-296374 | 12/1988 | Japan | 357/23.3 |
| 64-761 | 1/1989 | Japan | 357/23.3 |
| 1-125977 | 5/1989 | Japan | 357/23.3 |
| 1-264265 | 10/1989 | Japan | 357/23.3 |

OTHER PUBLICATIONS

American Institute of Physics Handbook by Gray et al., 1982, pp. 9–109 to 9–112.

Semiconductor Devices—Physics and Technology, S. M. Sze, Jan. 1985, p. 472.

Semiconductor Devices—Physics and Technology, S. M. Sze, Jan., 1985, p. 513, Appendix F. "Properties of Important Semiconductors at 300K".

*Primary Examiner*—Steven H. Loke
*Attorney, Agent, or Firm*—Oblon, Spivak, McClelland, Maier & Neustadt, P.C.

[57] ABSTRACT

An MOS field effect transistor is of a lightly doped drain structure. In the transistor, an insulation layer is located on the side wall of a gate electrode. This insulation layer is formed of tantalum oxide, which has a high dielectric constant. Between this insulation layer and a drain region, another insulation layer is formed such that it has a thickness sufficiently greater than the length of the mean free path of the hot carriers which are generated in the vicinity of the drain region.

3 Claims, 4 Drawing Sheets

MOS FIELD EFFECT TRANSISTOR AND METHOD FOR MANUFACTURING THE SAME

This application is a continuation of application Ser. No. 07/590,810, filed on Oct. 1, 1990, now abandoned.

BACKGROUND OF THE INVENTION

1. Field of the Invention

The present invention relates to an MOS field effect transistor having an LDD structure.

2. Description of the Related Art

As an MOS field effect transistor which is suitable for miniaturization of electronic devices, a transistor having a lightly doped drain structure (hereinafter referred to as an "LDD transistor") is well known in the art. FIG. 1 is a sectional view showing the element structure of a conventional LDD transistor. As is shown in FIG. 1, a gate electrode 33 is formed on a p-type silicon semiconductor substrate 31, such that a silicon oxide film 32 having a thickness of e.g. 150 Å is interposed therebetween. Two $n^-$-type regions 34 and 35 each having a comparatively low impurity concentration and two $n^+$-type regions 37 and 38 each having a comparatively high impurity concentration, are formed inside the substrate 31. The $n^-$-type regions 34 and 35 are formed by ion implantation of n-type impurities by using the gate electrode 33 as a mask, while the $n^+$-type regions 37 and 38 are formed by ion implantation of n-type impurities by using a CVD oxide film 36 located on the side wall of the gate electrode 33 as a mask. The $n^-$-type region 34 and the $n^+$-type region 37 jointly constitute a drain region, while the $n^-$-type region 35 and $n^+$-type region 38 jointly constitute a source region.

Even if a high voltage is applied to the drain region of the above LDD transistor, the intensity of a drain field is reduced, due to the existence of the low-impurity concentration $n^-$-type region 34. For this reason, the impact ionization in the vicinity of the drain is suppressed when a current flows between the source and drain regions. As a result, the number of hot carriers generated is small, so that high reliability is achieved.

In the LDD transistor, however, the low-impurity concentration $n^-$-type region 34 is located between the source and drain regions. Since, therefore, a depletion layer is constantly formed inside the $n^-$type region 34, the current-driving ability of the LDD transistor is not as good as that of an ordinary-structure MOS transistor. Thus, it is impossible for the LDD transistor to produce a drain current in large quantities.

In an effort to improve the current-driving ability, a so-called inverse "T" type LDD transistor has been developed, wherein the gate electrode is in the form of an inverse "T". However, the manufacturing process of this type of LDD transistor is complex, since the gate electrode has to be worked in the shape of an inverse "T".

SUMMARY OF THE INVENTION

Accordingly, the first object of the present invention is to provide an MOS field effect transistor which enables miniaturization of an element to the same degree as in the prior art, has improved ability to drive current, and is easy to manufacture. The second object of the present invention is to provide a method for manufacturing such an MOS field effect transistor.

To achieve the first object, the present invention provides an MOS field effect transistor which comprises: a semiconductor substrate of a first conductivity type; a source region and a drain region, both of a second conductivity type, which are formed inside the substrate and are isolated from each other by a predetermined distance; a first insulation layer formed on the substrate and located between the source region and the drain region; a gate electrode conductive layer formed on the first insulation layer; a pair of second insulation layers formed on opposing side walls of the gate electrode conductive layer, respectively, and having a dielectric constant larger than that of the first insulation layer; and a third insulation layer formed between the second insulation layers and the source and drain regions, the third insulation layer having a thickness which is greater than that of the first insulation layer and which is greater than the length of a mean free path of hot carriers generated in the vicinity of the drain region.

To achieve the second object, the present invention provides an MOS field effect transistor-manufacturing method which comprises the steps of: forming a first insulation layer on a semiconductor substrate of a first conductivity type; depositing a conductive layer on the first insulation layer; selectively removing a laminated structure made up of the conductive layer and the first insulation layer, such that the laminated structure has a predetermined shape; forming a second insulation layer, which is thicker than the first insulation layer, over the resultant semiconductor structure such that the second insulation layer is formed at least on the laminated structure; forming a low-concentration impurity region in the substrate by introducing impurities of a second conductivity into the substrate at a low doping rate, with the laminated structure used as a mask; depositing a third insulation layer, which has a dielectric constant larger than that of the first insulation layer, over the semiconductor structure by chemical vapor deposition; removing the third insulation layer by anisotropic etching such that the third insulation layer is left on the opposing side walls of the conductive layer; and forming a high-concentration impurity region in the substrate by introducing impurities of the second conductivity into the substrate, with the third insulation layer left on the Opposing side walls of the conductive layer being used as a mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

DETAILED DESCRIPTION OF THE PREFERRED EMBODIMENT

Figure 1:
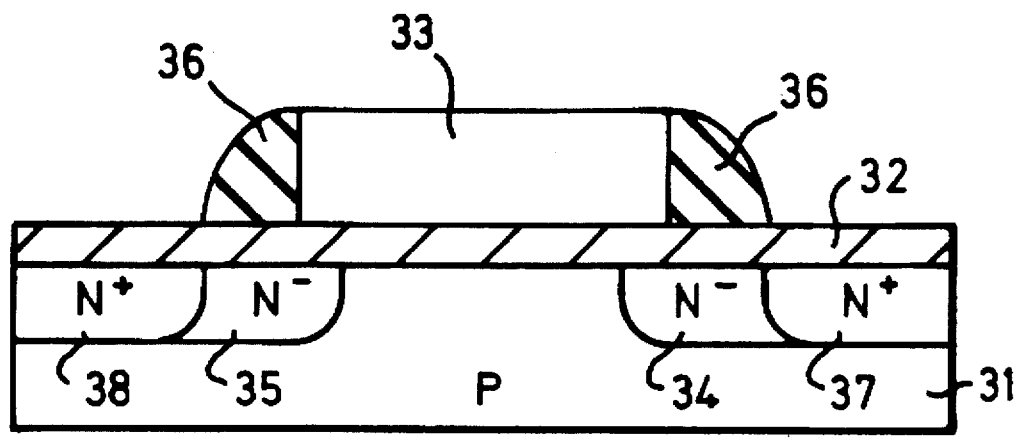
FIG. 1 is a sectional view showing the element structure of a conventional LDD transistor.
Figure 2:
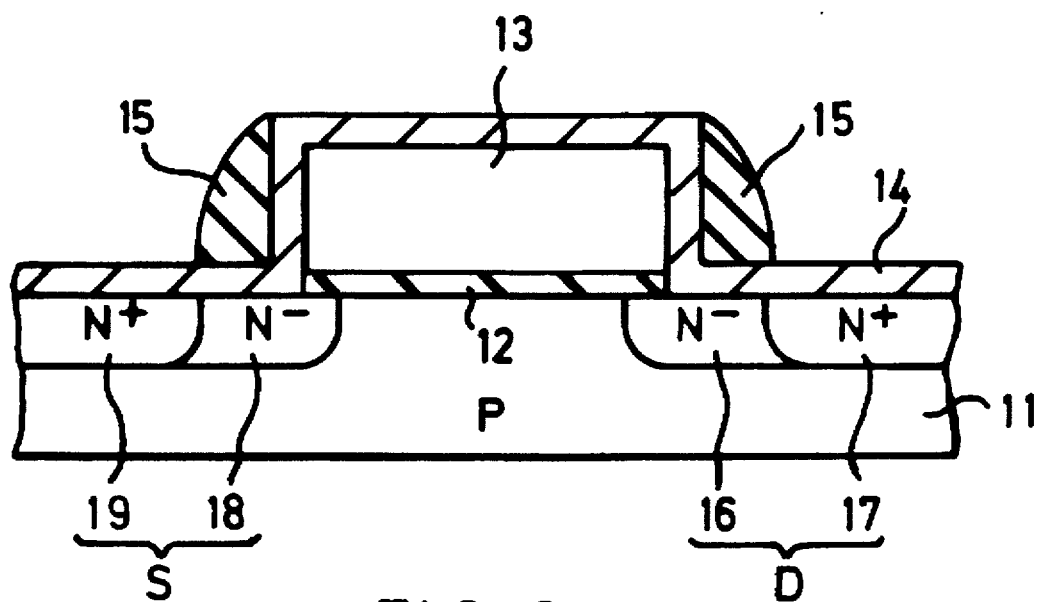
FIG. 2 is a sectional view showing the element structure of an LDD transistor according to one embodiment of the present invention.

FIG. 2 illustrates the element structure of an LDD transistor according to one embodiment of the present invention.

Referring to FIG. 2, a silicon oxide film 12 having a thickness of e.g. 60 Å is formed on part of the surface of a p-type silicon semiconductor substrate 11. A polysilicon gate electrode 13 is formed on the silicon oxide film 12. The gate electrode 13 has reduced resistance since a conductive material, such as impurities, is introduced into it. A silicon oxide film 14 having a thickness of e.g. 90 Å is formed on the surfaces of both the substrate 11 and the gate electrode 13. On a pair of opposing side walls of the gate electrode 13, an insulation film 15 is formed, with the silicon oxide film 14 interposed. The insulation film 15 is formed of a material whose dielectric constant is at least larger than the dielectric constant of silicon oxide. For example, the insulation film 15 is formed of tantalum oxide ($Ta_2O_5$). In general, the larger the dielectric constant of an insulation film is, the smaller will be the amount of band gap energy. Thus, the insulation film 15 has a smaller amount of band gap energy than that of the silicon oxide 14. Parenthetically, the band gap energy of the silicon oxide film 14 is approximately 9 eV.

A drain region D and a source region S are formed in a surface region of the substrate 11. The drain region D is made up of: an $n^-$ region 16 which contains a comparatively low concentration of phosphorous (P) as n-type impurities; and an $n^+$-type region 17 which is adjacent to the $n^-$-type region 16 and contains a comparatively high concentration of arsenic (As) as n-type impurities. Likewise, the source region S is made up of: an $n^-$ region 18 which contains a comparatively low concentration of phosphorous (P); and an $n^+$-type region 19 which is adjacent to the $n^-$-type region 18 and contains a comparatively high concentration of arsenic (As).

As is shown in FIG. 2, the $n^+$-type region 17 of the drain region and the $n^+$-type region 19 of the source region S are located on the laterally outer sides than the side walls of the gate electrode 13.

In the LDD transistor having the above-mentioned structure, the insulation film 15 which is formed of a material having a large dielectric constant is located on the side walls of the gate electrode 13. When the gate electrode 13 is applied with a predetermined voltage of positive polarity, an intense electric field is generated from the side faces of the gate electrode toward the substrate 11.

Figure 3:
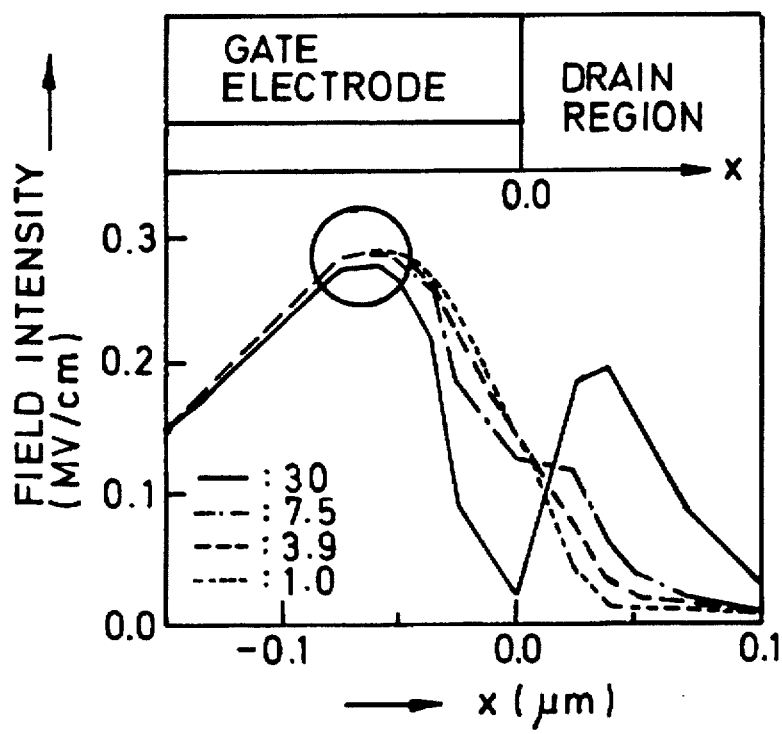
FIGS. 3 and 4 are graphs showing the characteristics of the LDD transistor of the embodiment.

To examine the characteristics of an LDD transistor having the structure illustrated in FIG. 2, two-dimensional device simulation was carried out. The results of this simulation are shown in FIG. 3. In the graph shown in FIG. 3, the origin corresponds to a point located in the boundary between the gate electrode 13 and the drain region D, the abscissa represents the horizontal distance X (μm) by which a given point is located away from the point of the boundary, and the ordinate represents the field intensity (MV/cm) measured at the given point. In the two-dimensional device simulation, the gate length was 0.5 μm, the gate voltage was 3V, and the drain voltage was 6V. In the graph shown in FIG. 3, the data indicated by the solid lines corresponds to a device embodying the present invention, wherein the insulation films 15 on the side walls of the gate electrode 13 are formed of tantalum oxide whose dielectric constant $\epsilon$ is 30. The data indicated by the dot-dash broken lines corresponds to a device wherein the insulation films 15 are formed of silicon nitride ($Si_3N_4$) whose dielectric constant $\epsilon$ is 7.5. The data indicated by the long-stroke broken lines corresponds to a device wherein the insulation films 15 are formed of silicon oxide ($SiO_2$) whose dielectric constant $\epsilon$ is 3.9. The data indicated by the short-stroke broken lines corresponds to a device wherein no insulation film is formed on the side walls of the gate electrode 13 is formed of silicon nitride ($Si_3N_4$), that is, a vacuum state (dielectric constant $\epsilon$: 1.0) is assumed in this case.

In the transistor of the embodiment device comprising the tantalum oxide insulation film 15, the intensity of the drain electric field is considerably reduced in the neighborhood of the gate electrode, as is seen from the portion circled in the FIG. 3 graph. This phenomenon is attributable to the fact that the insulation film 15 (which has a large dielectric constant) reduces the maximum electric field acting in the plane of the silicon substrate surface and narrows the range of the maximum electric field. Since the intensity of the drain electric field is considerably reduced in the neighborhood of the gate electrode, the impact ionization is suppressed in the vicinity of the drain, even when an ON current is made to flow between the source and drain regions by providing a predetermined potential difference therebetween. Therefore, the generation of hot carriers is suppressed, so that high reliability of the device is attained.

In connection of the embodiment device, it should be also noted that the 90 Å-thick silicon oxide film 14 is located between the drain region D and the insulation film 15. The thickness of the silicon oxide film 14 is far greater than the length (length: about 20 Å) of the mean free path of hot carriers which may be generated in the vicinity of the drain region as a result of the impact ionization. In addition, the band gap energy of the silicon oxide film 14 is as high as 9 eV. Therefore, even if hot carriers are generated in the vicinity of the drain, the hot carriers hardly pass through the silicon oxide film 14 or reach the insulation film 15. As a result, very few hot carriers are trapped in the interior of the insulation film 15 or in the interface between the insulation films 14 and 15. Consequently, the reliability of the device is improved.

Like the prior art device, the embodiment device is of an LDD structure. Thus, an element can be miniaturized to substantially the same degree as in the prior art.

Figure 4:
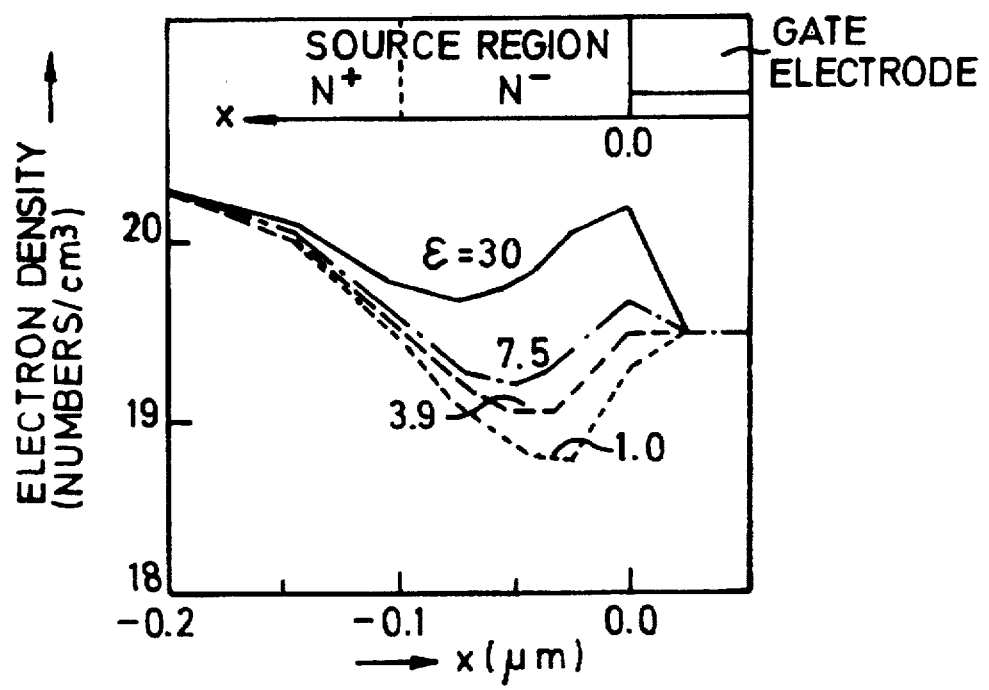

To further examine the characteristics of the LDD transistor having the structure illustrated in FIG. 2, two-dimensional device simulation was carried out, with the gate voltage and the drain voltage both set to be 3V. The results of this simulation are shown in FIG. 4. In the graph shown in FIG. 4, the origin corresponds to a point located in the boundary between the gate electrode 13 and the source region S, the abscissa represents the horizontal distance X (μm) by which a given point is located away from the point of the boundary, and the ordinate represents the electron density (numbers/$cm^3$) measured at the given point. In the graph shown in FIG. 4, the data indicated by the solid lines corresponds to a device wherein the insulation film 15 is formed of tantalum oxide whose dielectric constant $\epsilon$ is 30, the data indicated by the dot-dash broken lines corresponds to a device wherein the insulation film 15 is formed of silicon nitride ($Si_3N_4$) whose dielectric constant $\epsilon$ is 7.5, the data indicated by the long-stroke broken lines corresponds to a device wherein the insulation film 15 is formed of silicon oxide ($SiO_2$) whose dielectric constant $\epsilon$ is 3.9, and the data indicated by the short-stroke broken lines corresponds to a device wherein no insulation film is formed and a vacuum state (dielectric constant $\epsilon$: 1.0) is assumed.

As is apparent from the graph shown in FIG. 4, the electron density in the $n^-$-type layer 18 of the source region S increases with an increase in the intensity of the electric field generated from the side of the gate electrode. However, the electron density in the source region S is dependent on the dielectric constant $\epsilon$ of the insulation film 15. In other words, the larger the dielectric constant $\epsilon$ of the insulation film 15 is, the higher the electron density in the source region S is. In the case where the insulation film 15 is formed of tantalum oxide (whose dielectric constant $\epsilon$ is as large as 30), the range of the depletion layer inside the $n^+$-type region 17 is narrow. For this reason, the parasitic resistance of the $n^-$-type region of the embodiment device is decreased, thus increasing the drain current. In short, the MOS transistor of the embodiment has high ability to drive current.

In the embodiment device mentioned above, the insulation film 15 located on the side walls of the gate electrode 13 is formed of tantalum oxide having a large dielectric constant $\epsilon$, and the silicon oxide film 14, whose thickness is far greater than the length of the mean free path of hot carriers, is located between the insulation film 15 and the drain region D. With this structure, both the hot carrier effect and the parasitic resistance can be suppressed. In addition, the hot carriers are prevented from entering the interior of the insulation film 15. Therefore, the embodiment device is very reliable and has high current-driving ability.

The method for manufacturing the above LDD transistor will now be described, with reference to FIGS. 5A to 5F. In FIGS. 5A-5F, the same reference numerals as in FIG. 2 are used to denote the structural elements corresponding to those shown in FIG. 2.

Figure 5A:
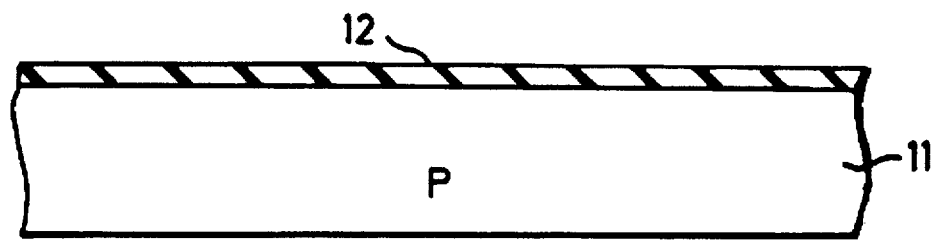
FIGS. 5A–5F are sectional views illustrating a process in which the LDD transistor of the embodiment is manufactured.
Figure 5B:
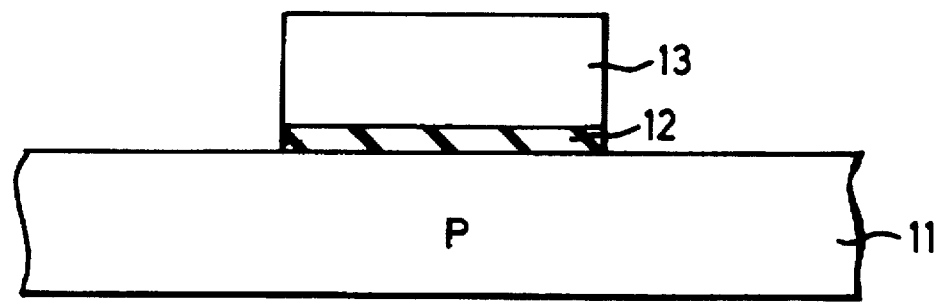

Referring first to FIG. 5A, the surface of a p-type silicon semiconductor substrate 11 is thermally oxidized, so as to form a 60 Å-thick silicon oxide film 12 on the entire surface of the substrate. Subsequently, a 0.2 μm-thick polysilicon layer is deposited over the resultant semiconductor structure by chemical vapor deposition (CVD). The silicon oxide layer 12 and the polysilicon layer jointly constitute a laminated film. Then, this laminated film is selectively removed, to thereby form a gate electrode 13 having a predetermined shape, as is shown in FIG. 5B. When the polysilicon layer is being deposited or has been deposited, n-type or p-type impurities are introduced, so that the resultant gate electrode 13 has reduced resistance. The impurities may be introduced after the gate electrode 13 is patterned into the predetermined shape.

Figure 5C:
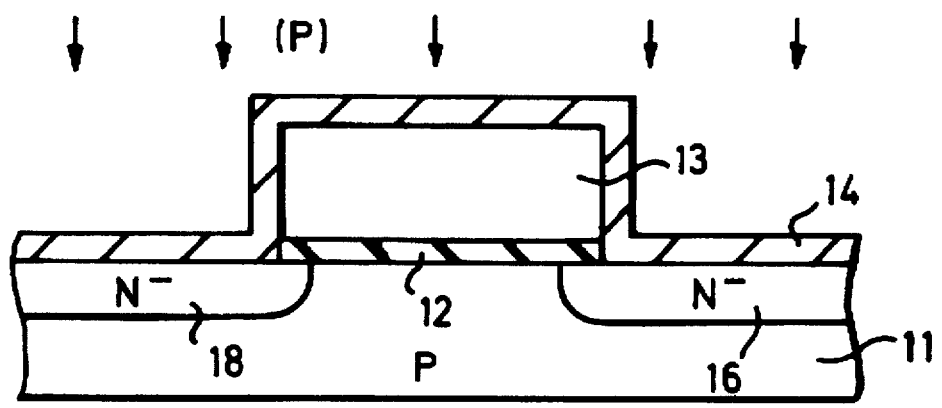

As is shown in FIG. 5C, a 90 Å-thick silicon oxide film 14 is formed on the surface of the gate electrode 13 and that of the substrate 11 by thermal oxidation. Subsequently, by use of the gate electrode 13 as a mask, phosphorous (P) is ion-implanted into the substrate 11 by application of an acceleration voltage of 40 KeV and in a dose of $5 \times 10^{13}$ atoms/cm$^2$, to thereby form $n^-$-type regions 15 and 17 having a comparatively low impurity concentration.

Figure 5D:
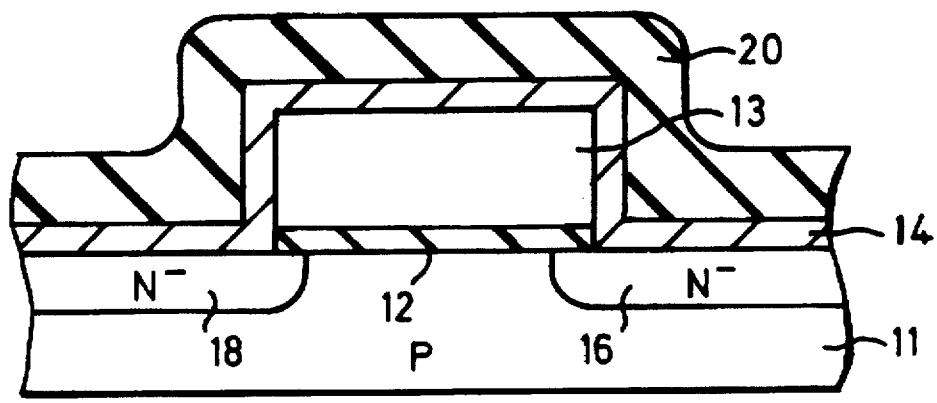
Figure 5E:
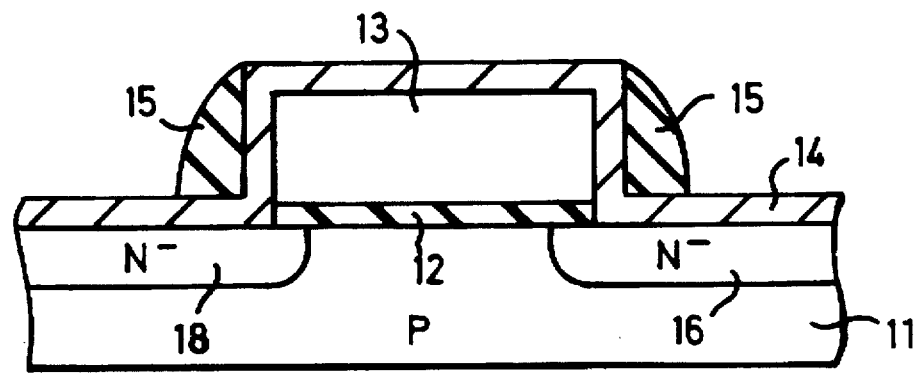

As is shown in FIG. 5D, a tantalum oxide ($Ta_2O_5$) film 20 having a thickness of 0.15 μm is deposited by CVD over the semiconductor structure, including the surface of the gate electrode 13. The tantalum oxide film 20, thus deposited, is removed by reactive ion etching (RIE), such that the tantalum oxide film 20 is left only on a pair of opposing side walls of the gate electrode 13, as is shown in FIG. 5E. The tantalum oxide film 20 left on the opposing side walls constitutes an insulation film 15.

Figure 5F:
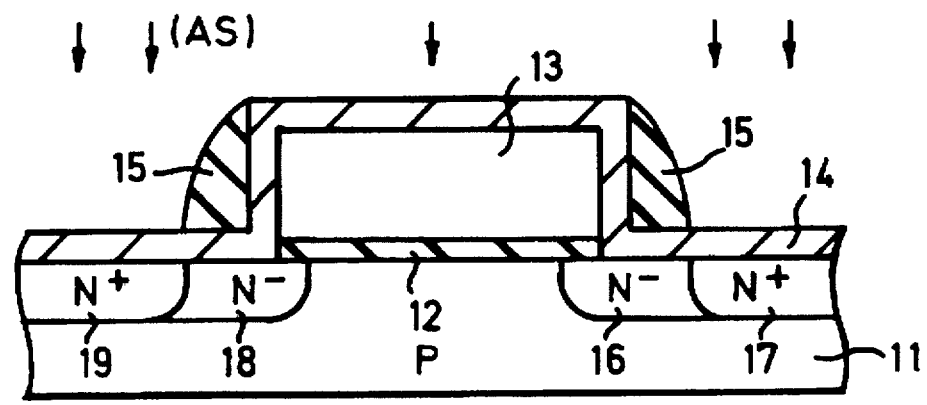

Then, by use of both the gate electrode 13 and the insulation film 15 as a mask, arsenic (As) is ion-implanted into the substrate 11 by application of an acceleration voltage of 40 KeV and in a dose of $5 \times 10^{15}$ atoms/cm$^2$. As a result of this ion implantation, $n^+$-type regions 17 and 19 having a comparatively high impurity concentration are formed in the substrate 11, as is shown in FIG. 5F. In this manner, the manufacture of the LDD transistor shown in FIG. 2 is completed.

The present invention is not limited to the embodiment mentioned above, and may be modified in various manners without departing from the spirit and scope of the invention. The above embodiment was described, referring to the case where the insulation film 15 was formed of tantalum oxide. However, the insulation film 15 may be formed of any dielectric material as long as this material has a dielectric constant larger than that ($\epsilon=3.9$) of the silicon oxide film. In the above embodiment, the silicon oxide film 12 constitutes a gate insulation film, but this gate insulation film may be constituted by a laminated film made up of a silicon oxide film and a silicon nitride film. In other words, the gate insulation film may be either a so-called ONO film, a oxy-nytride film, or the like.

In the above explanation of the method of the embodiment, the low-impurity concentration $n^-$-type regions 15 and 17 were described, with reference to FIG. 5C, as being formed by ion implantation after the formation of the silicon oxide film 14. However, the step of forming the $n^-$-type regions 15 and 17 may be carried out first, being followed by the step of forming the silicon oxide film 14 over the semiconductor structure.

As described in the foregoing, the present invention can provide an MOS field effect transistor which enables miniaturization of an element to the same degree as in the prior art, has improved ability to drive current, and is easy to manufacture. The present invention can also provide a method for manufacturing such an MOS field effect transistor.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An MOS field effect transistor, comprising:

a semiconductor substrate of a first conductivity type;

a source region and a drain region, both of a second conductivity type, which are formed inside the substrate and are isolated from each other by a predetermined distance;

a first insulation layer formed in the substrate and located between the source region and the drain region;

a gate electrode conductive layer formed on the first insulation layer;

a pair of second insulation layers formed on opposing side walls of the gate electrode conductive layer, respectively, and having a dielectric constant greater than 7.5; and a third insulation layer formed of silicon oxide between the second insulation layers and the source and drain regions, said third insulation layer having a thickness of 90 Å which is greater than the length of a mean free path of hot carriers generated in the vicinity of the drain region.

2. An MOS field effect transistor, comprising:

a semiconductor substrate of a first conductivity type;

a source region and a drain region, both of a second conductivity type, which are formed inside the substrate and are isolated from each other by a predetermined distance;

a first insulation layer formed on the substrate and located between the source region and the drain region;

a gate electrode conductive layer formed on the first insulation layer;

a pair of second insulation layers formed on opposing side walls of the gate electrode conductive layer, respectively, and having a dielectric constant greater than 7.5; and a third insulation layer which is formed between the second insulation layers and the source and drain regions, has a thickness of 90 Å greater than the length of the mean free path of hot carriers generated in the vicinity of the drain region, and has a larger amount of band gap energy than the second insulation layers.

3. An MOS field effect transistor, comprising:

a semiconductor substrate of a first conductivity type;

a source region and a drain region, both of a second conductivity type, which are formed inside the substrate and are isolated from each other by a predetermined distance;

a first insulation layer formed on the substrate and located between the source region and the drain region;

a gate electrode conductive layer formed on the first insulation layer;

a pair of second insulation layers formed on opposing side walls of the gate electrode conductive layer, respectively, and having a dielectric constant greater than 7.5; and a third insulation layer formed between the second insulation layers and the source and drain regions, said third insulation layer having a thickness less than 90 Å which is greater than the length of a mean free path of hot carriers generated in the vicinity of the drain region.

* * * * *